United States Patent
Park

(10) Patent No.: US 10,114,078 B2
(45) Date of Patent: Oct. 30, 2018

(54) METHOD AND APPARATUS TO ESTIMATE STATE OF BATTERY BASED ON BATTERY CHARGING VOLTAGE DATA

(71) Applicant: Samsung Electronics Co., Ltd., Suwon-si (KR)

(72) Inventor: Jeonghyun Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 397 days.

(21) Appl. No.: 14/849,913

(22) Filed: Sep. 10, 2015

(65) Prior Publication Data

US 2016/0231388 A1 Aug. 11, 2016

(30) Foreign Application Priority Data

Feb. 6, 2015 (KR) .................. 10-2015-0018829

(51) Int. Cl.
*G01R 31/36* (2006.01)
(52) U.S. Cl.
CPC ....... *G01R 31/3679* (2013.01); *G01R 31/362* (2013.01); *G01R 31/3651* (2013.01)
(58) Field of Classification Search
None
See application file for complete search history.

(56) References Cited

U.S. PATENT DOCUMENTS

| | | | |
|---|---|---|---|
| 8,004,243 B2 | 8/2011 | Paryani et al. | |
| 9,063,018 B1* | 6/2015 | Ghantous | G01K 1/14 |
| 2009/0088994 A1* | 4/2009 | Machiyama | B60L 11/1861 |
| | | | 702/63 |
| 2009/0155674 A1 | 6/2009 | Ikeuchi et al. | |
| 2012/0116701 A1 | 5/2012 | Yuasa | |
| 2013/0335009 A1 | 12/2013 | Katsumata et al. | |
| 2016/0003919 A1* | 1/2016 | Hirschbold | G01R 31/362 |
| | | | 324/433 |
| 2017/0038436 A1* | 2/2017 | Montaru | G01R 31/3651 |

FOREIGN PATENT DOCUMENTS

| | | |
|---|---|---|
| JP | 2007-271583 A | 10/2007 |
| JP | 2014-59270 A | 4/2014 |
| KR | 10-2008-0042227 A | 5/2008 |
| KR | 10-2012-0035537 A | 4/2012 |
| WO | WO 2011/090020 A1 | 7/2011 |

* cited by examiner

*Primary Examiner* — John Kuan
(74) *Attorney, Agent, or Firm* — NSIP Law

(57) ABSTRACT

A method and an apparatus to estimate a battery state include a sensor, a data extractor, and a state estimator. The sensor is configured to sense charging voltage data, and the data extractor is configured to extract partial data corresponding to a section from the sensed charging voltage data. The state estimator is configured to estimate a state of a current battery using the extracted partial data.

20 Claims, 12 Drawing Sheets

320

330

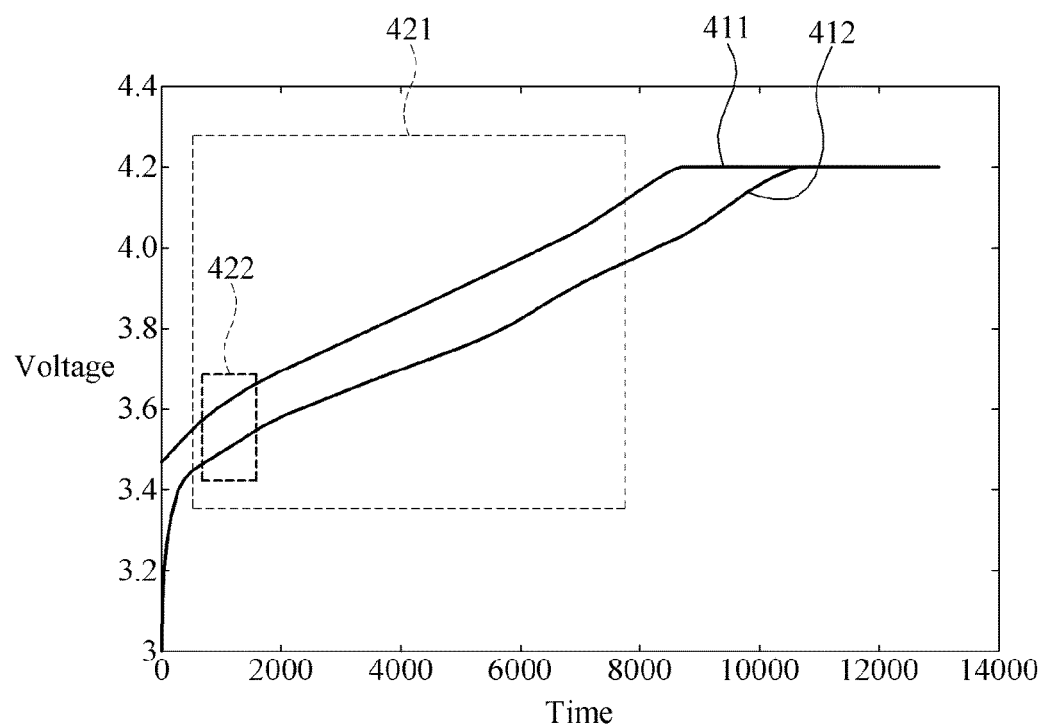

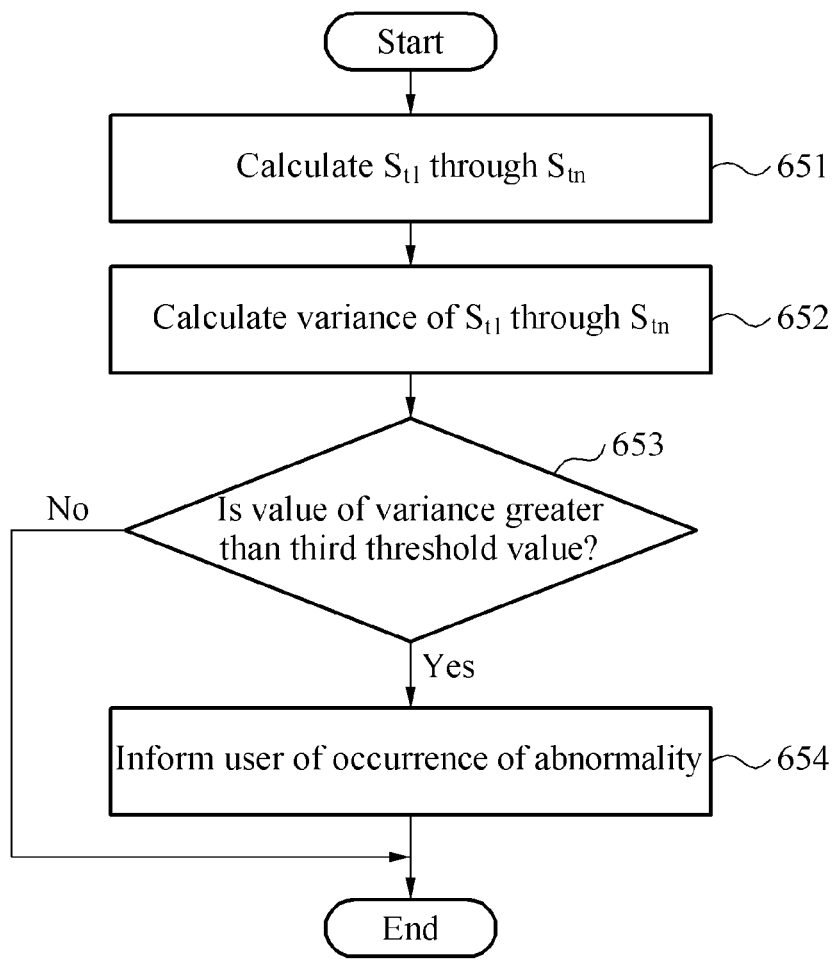

METHOD AND APPARATUS TO ESTIMATE STATE OF BATTERY BASED ON BATTERY CHARGING VOLTAGE DATA

CROSS-REFERENCE TO RELATED APPLICATION

This application claims the benefit under 35 USC 119(a) of Korean Patent Application No. 10-2015-0018829, filed on Feb. 6, 2015, in the Korean Intellectual Property Office, the entire disclosure of which is incorporated herein by reference for all purposes.

BACKGROUND

1. Field

The following description relates to an apparatus and a method to estimate a state of a battery based on battery charging voltage data.

2. Description of Related Art

Amid a growing importance of environmental issues and energy resources issues, electric vehicles are receiving attention as future transport vehicles. An electric vehicle uses, as a main power source, a battery in which chargeable and dischargeable secondary cells are formed in a single pack. The battery is environmentally friendly as it does not emit exhaust gases and produces an extremely low amount of noise.

The battery of the electric vehicle functions as an engine and a fuel tank of a gasoline-powered vehicle. Thus, ensuring a working state of the battery is vital for ensure safety of a user or a driver of the electric vehicle.

Conventionally, a method of setting a rule to define an abnormality of the battery and to estimate or to determine the abnormality is used. The rule defining the abnormality is based on an internal state of the battery and it is directly analyzed at a time of an occurrence of the abnormality. The abnormality is detected based on an estimated feature indicative of the abnormality. However, existing methods to verify an abnormality in advance and perform a proactive measure against the abnormality are still insufficient.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a battery state estimating apparatus, including a sensor configured to sense charging voltage data; a data extractor configured to extract partial data corresponding to a section from the sensed charging voltage data; and a state estimator configured to estimate a state of a current battery using the extracted partial data.

The charging voltage data may include charging voltage data of an initial battery life, charging voltage data of a battery at a battery life termination point, and charging voltage data of the current battery.

The data extractor may be configured to extract the partial data as charging voltage data by extracting the charging voltage data for an amount of time from the sensed charging voltage data, by extracting the charging voltage data at a time interval from the sensed charging voltage data, or by extracting the charging voltage data at a time interval for an amount of time from the sensed charging voltage data.

The data extracted from the sensed charging voltage data and data extracted from pre-obtained charging voltage data of an initial battery life may be extracted using a same extraction process.

The state estimator may include a calculator configured to calculate a distance between the partial data extracted at the data extractor and data extracted from pre-obtained charging voltage data of an initial battery life, wherein the state estimator is configured to estimate an abnormal state of the current battery based on the calculated distance.

The calculator may be configured to calculate the distance using at least one of a Euclidian distance calculation method, a Mahalanobis distance calculation distance, and a cosine similarity calculation method.

The calculator may be configured to further calculate a score $S_t$ using an equation $$S_t = 1 - \left(\frac{D_t}{D_{max}}\right),$$

and the state estimator may be configured to estimate the abnormal state of the current battery using the score $S_t$, wherein the score $S_t$ is used to verify the state of the current battery, $D_t$ denotes a distance between data extracted from charging voltage data of an initial battery life and the partial data extracted from the sensed charging voltage data of the current battery, and $D_{max}$ denotes a distance between the data extracted from the charging voltage data of the initial battery life and data extracted from charging voltage data of a battery at a battery life termination point.

The state estimator may be configured to estimate the abnormal state by comparing the score $S_t$ calculated at the calculator to a prestored score history.

The state estimator may be configured to estimate the abnormal state in response to a fluctuation range of the score $S_t$ being greater than a threshold value, and display a warning corresponding to the abnormal state.

The state estimator may be configured to estimate the abnormal state in response to a fluctuation range of the score $S_t$ being greater than an average of fluctuation ranges measured prior to the score $S_t$ and being less than the threshold value, and perform battery stabilization in response to the abnormal state.

The state estimator may be configured to calculate a variance of scores $S_t$, estimate the abnormal state in response to the calculated variance being greater than a threshold value, and display a warning corresponding to the abnormal state.

In accordance with an embodiment, there is provided a battery state estimating method, including sensing charging voltage data; extracting partial data corresponding to a section from the sensed charging voltage data; and estimating a state of a current battery using the extracted partial data.

The charging voltage data may include charging voltage data of an initial battery life, charging voltage data of a battery at a battery life termination point, and charging voltage data of the current battery.

The extracting of the partial data may include one of: extracting charging voltage data for an amount of time from the sensed charging voltage data, extracting charging voltage data at a time interval from the sensed charging voltage data, and extracting charging voltage data at a time interval for an amount of time from the sensed charging voltage data.

The estimating of the state of the current battery may include calculating a distance between the partial data extracted from the sensed charging voltage data and data extracted from pre-obtained charging voltage data of an initial battery life, and estimating an abnormal state of the current battery based on the calculated distance.

The calculating of the distance may include calculating the distance using one of a Euclidian distance calculation method, a Mahalanobis distance calculation distance, and a cosine similarity calculation method.

The estimating of the state of the current battery may further include calculating a score $S_t$ using an equation $$S_t = 1 - \left(\frac{D_t}{D_{max}}\right);$$

and estimating the abnormal state of the battery using the score $S_t$, wherein the score $S_t$ is used to verify the state of the current battery, $D_t$ denotes a distance between data extracted from charging voltage data of an initial battery life and the partial data extracted from the sensed charging voltage data of the current battery, and $D_{max}$ denotes a distance between the data extracted from the charging voltage data of the initial battery life and data extracted from charging voltage data of a battery at a battery life termination point.

The estimating of the state of the current battery may further include: estimating the abnormal state of the current battery in response to a fluctuation range of the score $S_t$ being greater than a threshold value; and displaying a warning corresponding to the abnormal state.

The estimating of the state of the current battery may further include: estimating the abnormal state of the current battery in response to a fluctuation range of the score $S_t$ being greater than an average of fluctuation ranges measured prior to the score $S_t$ and being less than a threshold value; and performing battery stabilization in response to the abnormal state.

In accordance with a further embodiment, there is provided a non-transitory computer-readable storage medium comprising a program comprising instructions to cause a computer to perform the method described above.

In accordance with another embodiment, there is provided a battery state estimating apparatus, including a sensor configured to sense charging voltage data; a data extractor configured to extract partial data corresponding to a section from the sensed charging voltage data; and a state estimator configured to estimate a state of the current battery based on a distance between data extracted from charging voltage data of an initial battery life and the partial data extracted from the sensed charging voltage data of the current battery, and a distance between the data extracted from the charging voltage data of the initial battery life and data extracted from charging voltage data of a battery at a battery life termination point.

In response to a fluctuation range of the calculated score being greater than a threshold value, the state estimator may be configured to estimate the state as a probability of an occurrence of an abnormality.

In response to the fluctuation range of the calculated score being greater than an average fluctuation range and less than the threshold value, the state estimator may be configured to estimate the state as an occurrence of deterioration in a performance of the battery.

In response to the score being less than 0, the state estimator may be configured to estimate the state as an internal structural abnormality by which a capacity of the battery rapidly decreases or a phenomenon in which numerous electrons are present in the battery due to a discharge profile.

Other features and aspects will be apparent from the following detailed description, the drawings, and the claims.

BRIEF DESCRIPTION OF THE DRAWINGS

FIG. 4 is a graph illustrating an example comparing entire data extraction and partial data extraction from charging voltage data, in accordance with an embodiment.

FIGS. 6 through 10 are flowcharts illustrating various examples of a battery state estimating method, in accordance with various embodiments.

Figure 1:
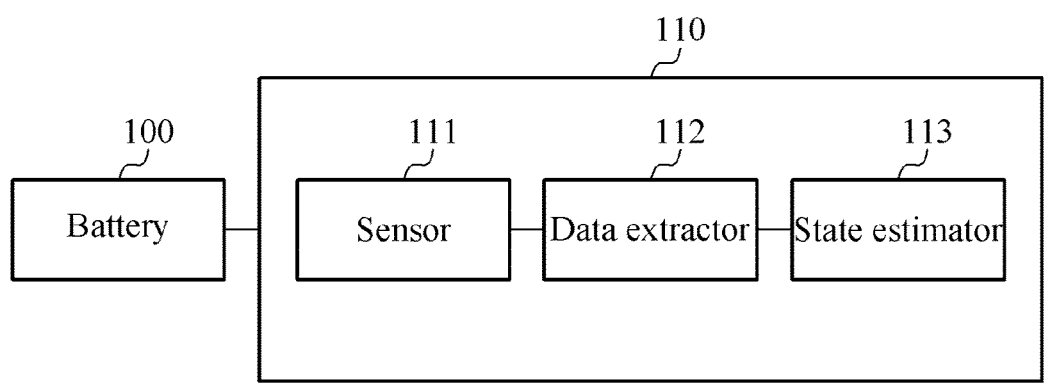
FIG. 1 is a block diagram illustrating an example of a battery state estimating apparatus, in accordance with an embodiment.

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations is described as an example; the sequence of operations is not limited to that set forth herein and may be changed as is known in the art, with the exception of steps and/or operations that necessarily occur in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

In addition, terms such as first, second, A, B, (a), (b), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one apparatus and corresponding method, an internal temperature of a battery may be detected before an abnormality occurs in the battery. The abnormality of the battery is detected when the temperature increases to be greater than the internal temperature or temperature range or the temperature rapidly increases, and, in response, a cooling system is activated. However, when such a temperature change occurs, the abnormality may not be readily prevented because an internal structure of the battery has already suffered significant structural change. To prevent such an issue, an apparatus and corresponding method is needed to minimize damage for an abnormality such as thermal runaway.

In accordance with a structural configuration, FIG. 1 is a block diagram illustrating an example of a battery state estimating apparatus 110, in accordance with an embodiment. The battery state estimating apparatus 110 described herein may refer to a structural apparatus to estimate a state of a battery.

Referring to FIG. 1, the battery state estimating apparatus 110 includes a sensor 111, a data extractor 112, and a state estimator 113.

The sensor 111 senses data from a battery 100. In an example, the sensor 111 collects data from the battery 100 and stores the collected data. The data includes charging voltage data. The charging voltage data is an open circuit voltage of the battery 100 being in a charging state.

The battery state estimating apparatus 110 further includes a database (not shown). The database stores charging voltage data of a battery life at an initial life point or an initial battery life released immediately after production and charging voltage data of a battery being at a battery life termination point. The initial battery life and the battery at the battery life termination point may be the same or the same types of batteries. The charging voltage data of the initial battery life uses an average value of sets of charging voltage data of the initial battery life obtained through a number of experiments.

The data extractor 112 extracts partial data from the charging voltage data sensed by the sensor 111. The data extractor 112 also extracts the charging voltage data of the initial battery life and the charging voltage data of the battery at the battery life termination point, which are stored in the database.

In an example, the data extractor 112 extracts charging voltage data for a predetermined amount of time from the charging voltage data sensed by the sensor 111 and the charging voltage data stored in the database. In another example, the data extractor 112 extracts charging voltage data at a predetermined interval from the charging voltage data sensed by the sensor 111 and the charging voltage data stored in the database. In still another example, the data extractor 112 extracts charging voltage data at a predetermined interval for a predetermined amount of time from the charging voltage data sensed by the sensor 111 and the charging voltage data stored in the database. In one example, the data to be extracted from the charging voltage data sensed by the sensor 111 and data to be extracted from the charging voltage data of the initial battery life stored in the database may be extracted using a same extraction process. The initial battery life is a battery released immediately after the production and of which performance is at its full capacity and has not deteriorated.

The data extractor 112 extracts partial data from data collected by the sensor 111. The data extractor 112 extracts a minimum quantity of the partial data used for calculating a distance between sets of the charging voltage data. The battery state estimating apparatus 110 performs a constant or a continuous monitoring function to prevent an abnormality from occurring in the battery 100. The battery state estimating apparatus 110 performs a monitoring function of the battery 100 and; thus, reducing a computation or a quality of calculation workload by monitoring the battery 100 using partial data from the data collected at the sensor 111 and the data extracted from the charging voltage data stored in the database. The data extractor 112 reduces the computation workload, or the quantity of calculation, by extracting, in one illustrative configuration, only the partial data from the collected data. The collected data includes the charging voltage data of the battery 100.

The state estimator 113 estimates a state of the battery 100 by measuring a distance between the partial data extracted by the data extractor 112 and partial data extracted from the data prestored in the database. The partial data to be collected may be expressed as a time axis X and a value axis Y. The distance between sets of the data is calculated using a Euclidian distance calculation method, a Mahalanobis distance calculation distance, a cosine similarity calculation method, and the like, in a two-dimensional space. Calculating of the distance will be further described with reference to FIG. 4.

Figure 2:
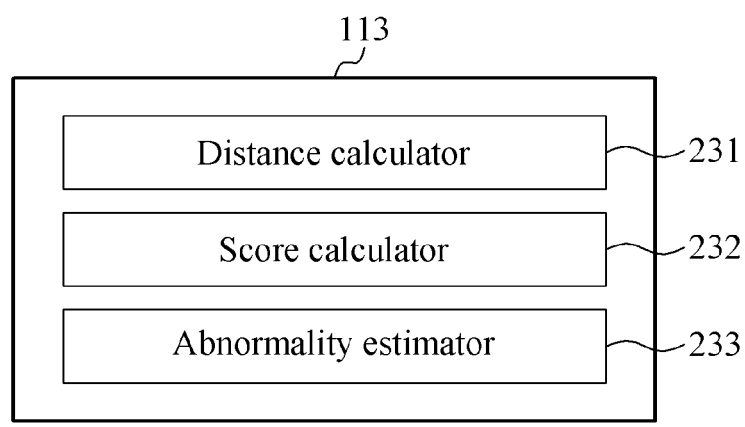
FIG. 2 is a block diagram illustrating a state estimator of the battery state estimating apparatus, in accordance with an embodiment.

FIG. 2 is a block diagram illustrating the state estimator 113 of FIG. 1, in accordance with an embodiment.

Referring to FIG. 2, the state estimator 113 includes a distance calculator 231, a score calculator 232, and an abnormality estimator 233.

The distance calculator 231 calculates a distance between data extracted from charging voltage data sensed by a sensor, for instance, sensor 111 illustrated and described with respect to FIG. 1, and data extracted from charging voltage data of an initial battery life stored in a database. That is, a change from data sensed from a current battery to data sensed from the initial battery life may be expressed as a numerical value. In one example, the current battery is a target battery for which a state is to be estimated, and the current battery and the initial battery life may be of a same type.

For example, a charging voltage "$V_s$" of an unused new battery and a charging voltage "$V_e$" of a battery at a battery life termination point are measured, and a distance "$D_{max}$" between two sets of data of the charging voltages, "$V_s$" and "$V_e$", is calculated. A value of $D_{max}$ is predefined, and updated by repetitively measuring $V_1$, and $V_e$. Values of $V_s$ and $V_e$ are measured through experimentation performed at various temperatures at which a battery is placed in an external environment. Results of the experiments are stored in a form of a database. The values of $V_s$ and $V_e$ suitable for a temperature at a corresponding point in time are used to obtain a score "$S_t$."

In one example, $D_{max}$ is not calculated during an operation of a battery state estimating apparatus, but defined in advance when an initial capacity of a battery is defined. Alternatively, $D_{max}$ is continuously calculated during the operation of the battery state estimating apparatus. A same extraction process is used to define initial battery life pack data is used to define $D_{max}$ in advance. By conducting numerous experiments, battery pack data at a battery life termination point is collected, an average of the collected data is calculated, and the data is updated.

A value of $D_{max}$ is updated in accordance with a method of extracting a portion of charging data because a method of continuously calculating the value of $D_{max}$ during the operation may change in accordance with the method of extracting a portion of charging data.

A distance difference, "$D_t$," between charging voltage data of the current battery and the charging voltage data of the initial battery life is calculated.

The score calculator 232 calculates $S_t$, which is a numerical value indicating a state of the current battery, using Equation 1 based on the distance calculated by the distance calculator 231.

$$S_t = 1 - \left(\frac{D_t}{D_{max}}\right) \qquad \text{[Equation 1]}$$

A value of $S_t$ calculated when a battery is being recharged after the battery is stably discharged is indicative of a capacity of the battery.

The abnormality estimator 233 estimates various abnormal states based on the calculated value of $S_t$. The abnormality estimator 233 estimates an abnormal state of the battery based on the value of $S_t$ calculated by the score calculator 232 and a history of previously calculated scores. In response to standard charging being performed after a residual of the battery is completely removed before charging data is collected, a calculated score is estimated to be equal to a ratio of a current battery capacity. In response to the score being calculated based on the details described in the foregoing, $D_{max}$, which is a maximum distance, corresponds to a maximum battery capacity, and a capacity used up to a present time corresponds to a value of $D_t$ calculated from the charging voltage data of the current battery. Thus, when a value of the score is less than 0, an abnormal state indicating that a battery life termination point may arrive shortly is estimated.

In an example, when a fluctuation range of the calculated score is greater than a predetermined threshold value, the abnormality estimator 233 estimates a probability of an occurrence of an abnormality. In another example, when the fluctuation range of the calculated score is greater than an average fluctuation range and less than the predetermined threshold value, the abnormality estimator 233 estimates an occurrence of a phenomenon that does not directly lead to an abnormality of the battery, but affects deterioration in a performance of the battery, and performs battery pack stabilization. In still another example, when the score is less than 0, the abnormality estimator 233 estimates an internal structural abnormality by which a capacity of the battery rapidly decreases or a phenomenon in which numerous electrons, yet to escape, are present in the battery due to a discharge profile. In yet another example, the abnormality estimator 233 calculates a variance of the score $S_t$, and estimates an occurrence of an abnormality in response to the calculated variance being greater than a predetermined threshold value.

Figure 3A:
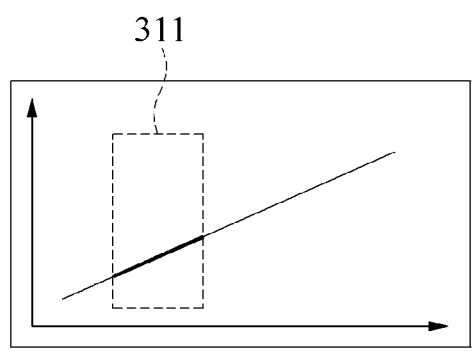
FIGS. 3A through 3C are graphs illustrating examples of extracting partial data by the battery state estimating apparatus, in accordance with an embodiment.
Figure 3B:
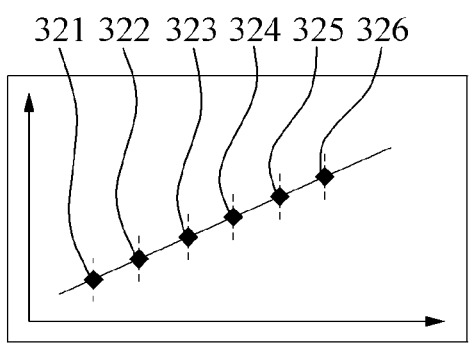
Figure 3C:
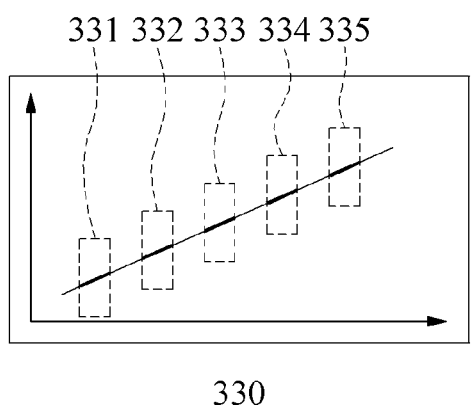

FIGS. 3A through 3C are graphs illustrating examples of extracting partial data by a battery state estimating apparatus, in accordance with an embodiment.

Referring to FIG. 3A, a graph 310 illustrates a first method of extracting partial data for a predetermined amount of time from charging voltage data. The first method of extracting the partial data for the predetermined amount of time includes calculating a distance using data 311 in a predetermined initial section. Thus, a capacity state of a battery is estimated before charging is completed and an appropriate measurement is performed in response to a result of the estimation.

Referring to FIG. 3B, a graph 320 illustrates a second method of extracting partial charging voltage data at a predetermined interval from charging voltage data. Sets of the partial data, for example, partial data 321, partial data 322, partial data 323, partial data 324, partial data 325, and partial data 326, are extracted from the charging voltage data during the predetermined interval.

Referring to FIG. 3C, a graph 330 illustrates a third method of extracting partial charging voltage data at a predetermined interval for a predetermined amount of time from charging voltage data. Sets of the partial data, for example, partial data 331, partial data 332, partial data 333, partial data 334, and partial data 335, are extracted from the charging voltage data at the predetermined interval during the predetermined amount of time.

Extracting the sets of the partial data using the second method illustrated in the graph 320 and the third method illustrated as in the graph 330 enables estimation of an abnormality using a variance to be described with reference to FIG. 10.

FIG. 4 is a diagram illustrating an example comparing entire data extraction and partial data extraction from charging voltage data, in accordance with an embodiment.

FIG. 4 illustrates a difference between a method of estimating a state of a battery using an entire charging voltage data 421, and a method of estimating a state of a battery using partial charging voltage data 422.

Referring to FIG. 4, a distance calculator of a battery state estimating apparatus measures a distance between a charging voltage data curve 411 of an initial battery life and a charging voltage data curve 412 of a current battery. In one example, when using the entire charging voltage data 421, a real-time battery performance inspection may not be possible. Thus, the battery state estimating apparatus estimates a state of a battery by extracting part of the charging voltage data or the partial charging voltage data 422.

For example, the battery state estimating apparatus extracts the partial charging voltage data 422 from the charging voltage data curve 411 and the charging voltage data curve 412, measures an average distance between sets of partial charging voltage data 421, and estimates a degree of deterioration in the battery.

Figure 5:
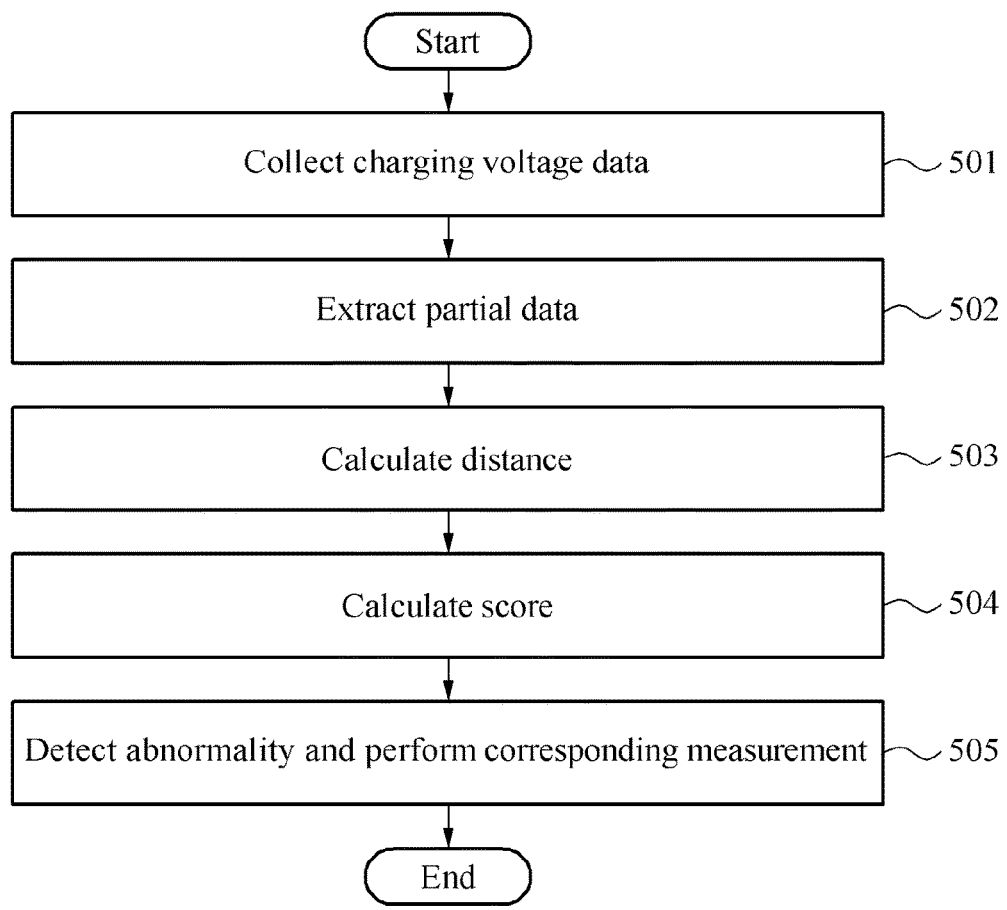
FIG. 5 is a flowchart illustrating an example of a battery state estimating method, in accordance with an embodiment.

FIG. 5 is a flowchart illustrating an example of a battery state estimating method, in accordance with an embodiment. The battery state estimating method to be described hereinafter is a method to estimate a state of a battery. The battery state estimating method is performed by the battery state estimating apparatus 110.

In operation 501, the battery state estimating apparatus 110 collects data of a current battery 100. The battery state apparatus 110 collects sets of data from the battery 100 and stores the collected data. The data includes charging voltage data.

In operation 502, the battery state estimating apparatus 110 extracts partial data from the collected charging voltage data. The battery state estimating apparatus 110 extracts partial data from sensed charging voltage data, charging voltage data of an initial battery life, and charging voltage data of a battery at a battery life termination point, which are stored in a database.

In operation 503, the battery state estimating apparatus 110 calculates a distance between the partial data extracted from the collected charging voltage data and the partial data extracted from the prestored charging voltage data. The charging voltage data is time-series data that varies over time. In an example, the calculation of the distance is performed using any one of a Euclidian distance calculation method, a Mahalanobis distance calculation distance, and a cosine similarity calculation method. The distance is calculated in a space obtained by converting a two-dimensional space of a time value to another dimension, which indicates a feature of the charging voltage data. In one example, a distance $D_{max}$ between the charging voltage data of the initial battery life and the charging voltage data of the battery at the battery life termination point, and a distance $D_t$ between the charging voltage data of the initial battery life and the charging voltage data of the current battery are calculated in an identical dimensional space.

In operation 504, the battery state estimating apparatus 110 calculates a score $S_t$ used to estimate a state of the current battery. In an example, a score "$S_t$" is calculated using Equation 2.

$$S_t = 1 - \left(\frac{D_t}{D_{max}}\right) \quad \text{[Equation 2]}$$

In Equation 2, "St" denotes a score used to verify a state of a battery. "Dt" denotes a distance between data extracted from a charging voltage data of an initial battery life and data extracted from a charging voltage data of the current battery. "$D_{max}$" denotes a distance between the data extracted from the charging voltage data of the initial battery life and data extracted from a charging voltage data of a battery at a battery life termination point.

In operation 505, the battery state estimating apparatus 110 detects an abnormality and performs a corresponding measure based on the calculated score $S_t$. In response to the abnormality being detected, the battery state estimating apparatus 110 estimates an abnormal state of the current battery. Thus, battery state estimating apparatus 110 displays a warning in response to the abnormal state, or performs battery stabilization.

FIGS. 6 through 10 are flowcharts illustrating detailed examples of a battery state estimating method, in accordance with various embodiments.

Figure 6:
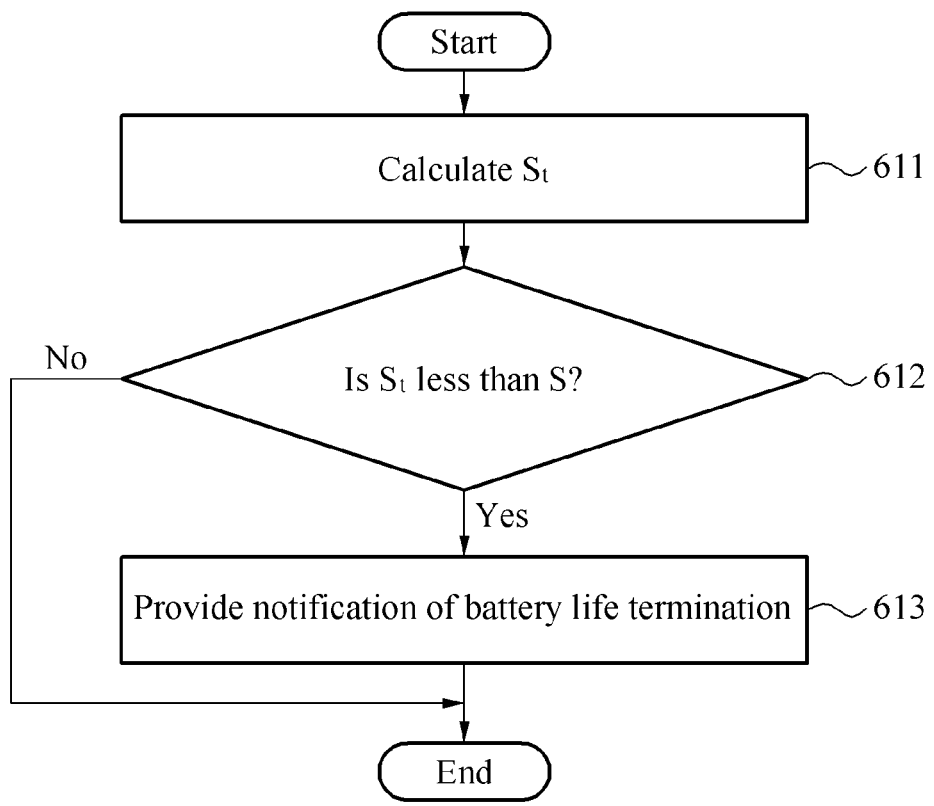

Referring to FIG. 6, in operation 611, the battery state estimating apparatus 110 calculates the score $S_t$. A method of calculating the score $S_t$ is described in operation 504 of FIG. 5, the description of which is hereby incorporated.

In operation 612, the battery state estimating apparatus estimates whether $S_t$ is less than a predetermined minimum score "S." In response to $S_t$ being less than S, operation 613 is executed. In response to $S_t$ being greater than or equal to S, the battery state estimating apparatus estimates a normal state of a battery, and terminates estimation of an abnormality.

In operation 613, in response to $S_t$ being less than S, the battery state estimating apparatus 110 transmits or outputs a notification of battery life termination. The battery state estimating apparatus 110 estimates an abnormal state indicating that a battery life termination point is to arrive within a predetermined short period of time, in an order of seconds, microseconds, or nanoseconds, and estimates the battery life termination. A score $S_t$ being close to 0 may not indicate an issue occurring in the battery, but rather an estimation of the battery life termination. Thus, the battery state estimating apparatus 110 predicts the battery life termination and informs a user of a need for a replacement battery.

Figure 7:
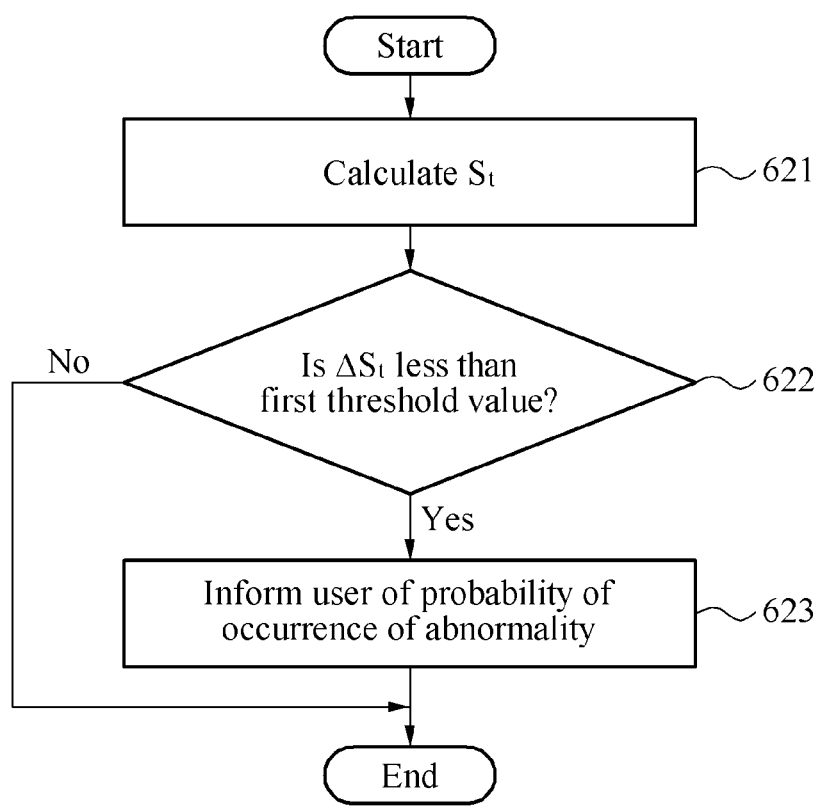

Referring to FIG. 7, in operation 621, the battery state estimating apparatus 110 calculates the score $S_t$.

In operation 622, the battery state estimating apparatus 110 estimates whether a fluctuation range of the score $S_t$ is less than a first threshold value. In one example, the first threshold value is a fluctuation range at which an abnormality occurs. When the score $S_t$ rapidly changes, a high probability of an occurrence of the abnormality is estimated. Although the first threshold value is estimated as an empirical value, a decrease in the score $S_t$ by more than 10 percent is set as the first threshold value. In response to the fluctuation range of the score $S_t$ being less than or equal to the first threshold value, the battery state estimating apparatus 110 estimates that no abnormality in the battery exists and terminates the estimation.

In operation 623, in response to the fluctuation range of the score $S_t$ being less than the first threshold value, the battery state estimating apparatus 110 informs the user of a probability of an occurrence of the abnormality. The battery state estimating apparatus 110 thus recommends the user to visit a nearest maintenance store or conduct a safety test on the battery.

Figure 8:
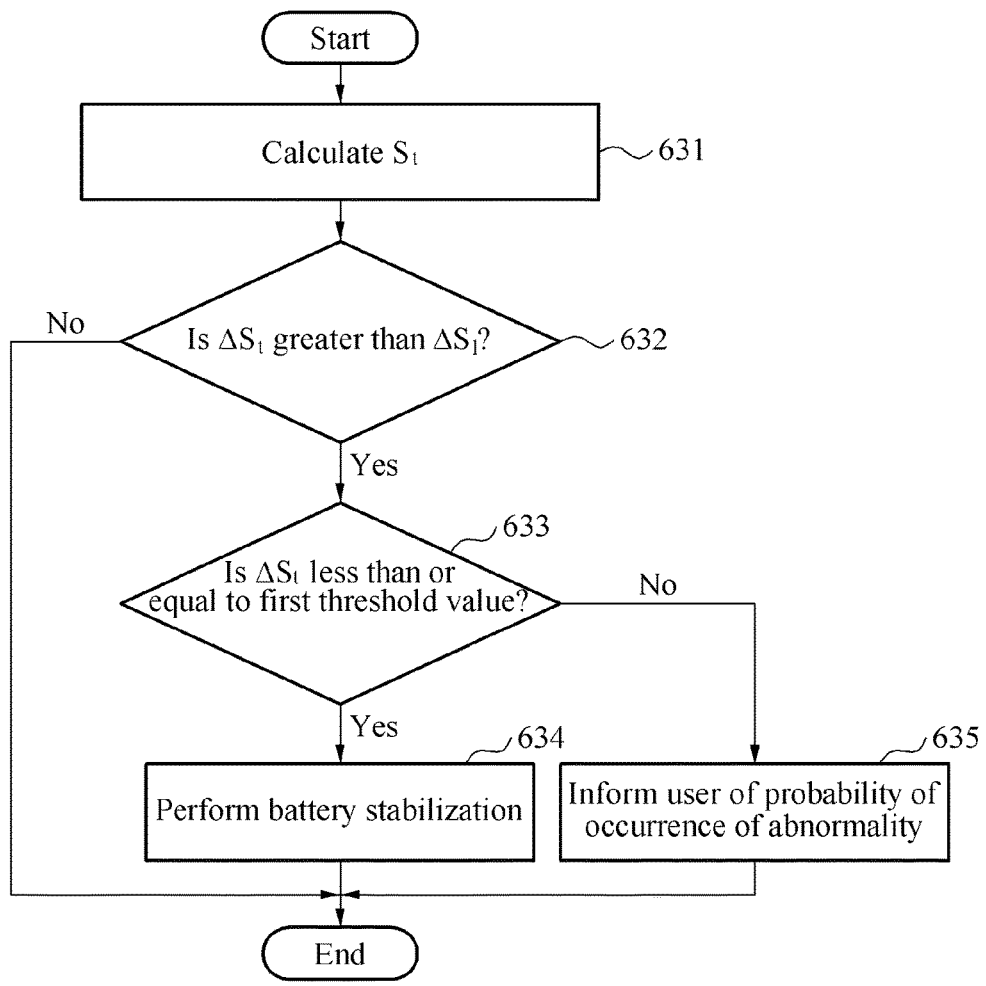

Referring to FIG. 8, in operation 631, the battery state estimating apparatus 110 calculates a score $S_t$.

In operation 632, the battery state estimating apparatus 110 estimates whether a fluctuation range of the score $S_t$ is greater than an average fluctuation range.

In operation 633, in response to the fluctuation range of the score $S_t$ being greater than the average fluctuation range, the battery state estimating apparatus 110 estimates whether the fluctuation range of the score $S_t$ is less than a first threshold value.

In response to the fluctuation range of the score $S_t$ being less than or equal to the average fluctuation range, the battery state estimating apparatus 110 estimates that no abnormalities exist in a battery and; thus, terminates the estimation.

In operation 634, in response to the fluctuation range of the score $S_t$ being greater than the average fluctuation range and less than or equal to the first threshold value, as determined in operation 633, the battery state estimating apparatus 110 estimates an occurrence of a phenomenon that does not directly lead to an abnormality of the battery, but affects deterioration in a performance of the battery, and performs battery pack stabilization.

In operation 635, in response to the fluctuation range of the score $S_t$ exceeding the first threshold value in operation 633, the battery state estimating apparatus 110 informs the user of a probability of an occurrence of an abnormality.

Figure 9:
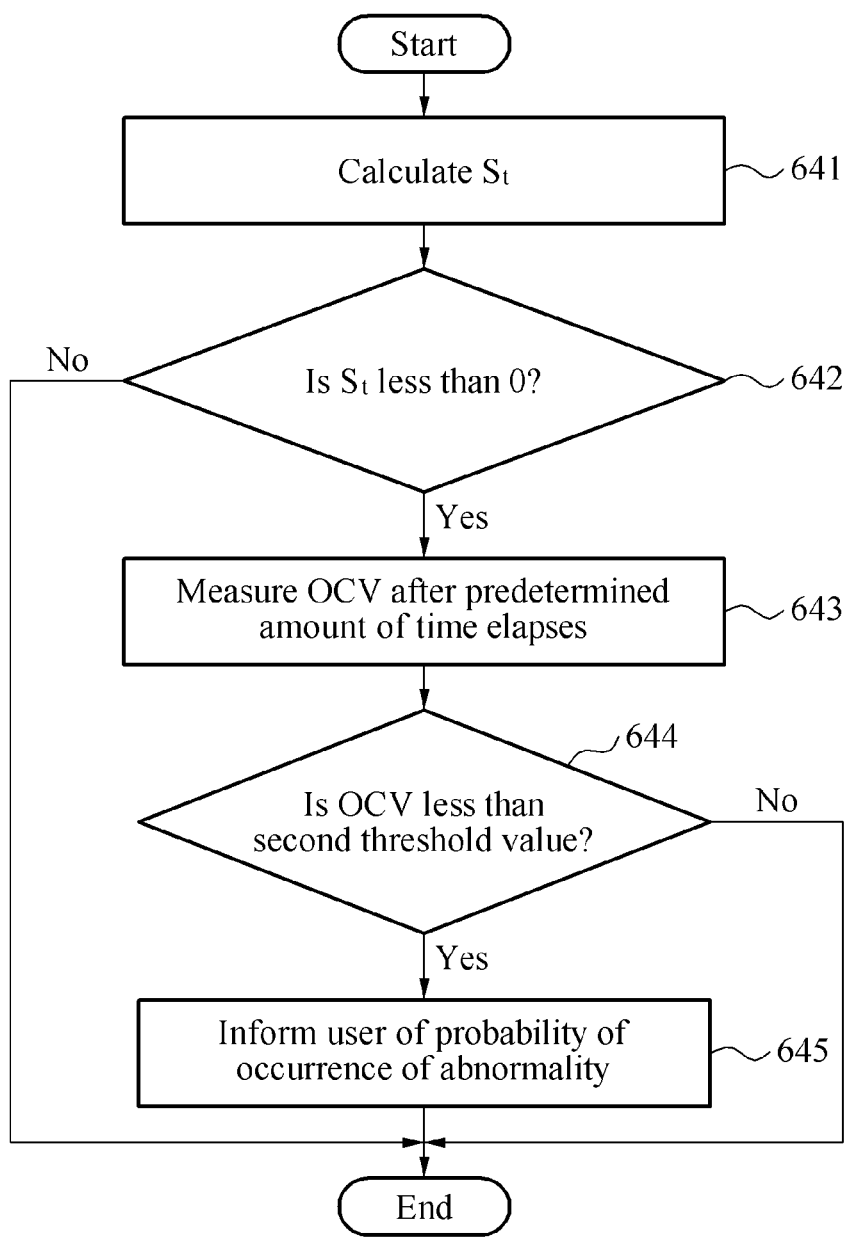

Referring to FIG. 9, in operation 641, the battery state estimating apparatus 110 calculates the score $S_t$. The method of calculating the score $S_t$ previously described is incorporated herein.

In operation 642, the battery state estimating apparatus 110 estimates whether the score $S_t$ is less than 0. In response to the score being greater than or equal to 0, the battery state estimating apparatus 110 estimates that no abnormalities exist in the battery 100 and terminates the estimation. The score $S_t$ being less than 0 may indicate that a distance $D_t$, which is a distance between charging voltage data of an initial battery life and charging voltage data of a current battery, is greater than a distance $D_{max}$, which is a distance between the charging voltage data of the initial battery life and the charging voltage data of the battery 100 at a battery life termination point. In such a case, two phenomena may be estimated. For example, an internal structural abnormality in which a capacity of the battery 100 rapidly decreases may occur. For another example, a phenomenon in which numerous electrons do not escape from the battery 100 due to a discharge profile may occur.

In operation 643, to determine a corresponding phenomenon of the two phenomena, the battery state estimating apparatus 110 measures an open circuit voltage (OCV) after a predetermined amount of time elapses.

In operation 644, the battery state estimating apparatus 110 estimates whether the OCV is less than a predetermined second threshold value. In operation 645, in response to the OCV being less than the second threshold value, the battery state estimating apparatus 110 estimates an abnormality of the battery 100 and informs the user of a result of the estimation. In response to the OCV being greater than or equal to the second threshold value, the battery state estimating apparatus 110 estimates no abnormalities exist and terminates the estimation of an abnormality because in such a case, a phenomenon in which numerous electrons do not escape from the battery due to the discharge profile exists.

Referring to FIG. 10, in operation 651, a battery state estimating apparatus 110 calculates a score, for example, $S_{t1}$ through $S_{tn}$, based on a predetermined time interval. In one example, a plurality of scores $S_{t1}$ through $S_{tn}$ is calculated using the method described with reference to the graph 320 of FIG. 3B and the graph 330 of FIG. 3C.

In operation 652, the battery state estimating apparatus 110 calculates a value of a variance of the scores.

In operation 653, in response to the calculated value of the variance being greater than a predetermined third threshold value, the battery state estimating apparatus 110 estimates or determines a high probability of an occurrence of an abnormality of a battery.

In operation 653, in response to the calculated value of the variance being less than or equal to the third threshold value, the battery state estimating apparatus 110 estimates that no abnormalities exist and terminates the estimation.

In operation 654, in response to the calculated value of the variance being greater than the third threshold value, the battery state estimating apparatus 110 informs a user of the occurrence of the abnormality and recommends the user to conduct a safety test on the battery 100.

The apparatuses, estimator, calculator, extractor, sensors, and other components illustrated in FIGS. 1 through 5 that perform the operations described herein with respect to FIGS. 6 through 10 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 6 through 10. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 6 through 10 that perform the operations described herein with respect to FIGS. 1 through 5 are performed by a processor or a computer as described above executing instructions or software to perform the operations described herein.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

Functional programs, codes, and code segments for implementing the examples disclosed herein can be easily constructed by a programmer skilled in the art to which the examples pertain based on the drawings and their corresponding descriptions as provided herein.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A computing apparatus for performing a real-time battery stabilization using battery state estimation, the computing apparatus comprising:
    one or more sensors configured to sense charging voltage data for a current battery and for a plurality of batteries at a battery life termination point, wherein the sensed charging voltage data for the plurality of batteries at the battery life termination point is pre-stored; and
    one or more processors, in communication with the one or more sensors, configured to:
        extract partial data corresponding to a section from the sensed charging voltage data;
        determine a first distance between data extracted from pre-stored charging voltage data of an initial battery life and the partial data extracted from the sensed charging voltage data of the current battery, for reducing a computation or calculation workload using the partial data in the determining of the first distance;
        determine a second distance between the data extracted from the pre-stored charging voltage data of the initial battery life and data extracted from the pre-stored charging voltage data of the plurality of batteries at the battery life termination point;
        determine a score using the first distance and the second distance; and
        estimate an abnormal state of the current battery using the score, such that the real-time battery stabilization is provided using a result of the estimating.

2. The apparatus of claim 1, wherein the sensed charging voltage data comprises charging voltage data of the initial battery life, charging voltage data of the plurality of batteries at the battery life termination point, and charging voltage data of the current battery.

3. The apparatus of claim 1, wherein the one or more processors are configured to extract the partial data, as charging voltage data by extracting the charging voltage data for a predetermined first amount of time from the sensed charging voltage data of the current battery, by extracting the charging voltage data at a predetermined time interval from the sensed charging voltage data of the current battery, or by extracting the charging voltage data at the predetermined time interval for the predetermined first amount of time from the sensed charging voltage data of the current battery.

4. The apparatus of claim 3, wherein the data extracted from the sensed charging voltage data and data extracted from pre-obtained charging voltage data of an initial battery life are extracted using a same extraction process.

5. The apparatus of claim 1, wherein the score is dependent on a relationship between the first distance and the second distance.

6. The apparatus of claim 1, wherein the one or more processors are configured to determine the first and second distances using at least one of a Euclidian distance calculation method, a Mahalanobis distance calculation distance, and a cosine similarity calculation method.

7. The apparatus of claim 1, wherein the one or more processors are configured to further
    calculate a score $S_t$ as the score using an equation $$S_t = 1 - \left(\frac{D_t}{D_{max}}\right),$$

wherein $D_t$ denotes the first distance, and $D_{max}$ denotes the second distance.

8. The apparatus of claim 1, wherein the one or more processors are further configured to estimate the abnormal state by comparing the determined score to a prestored score history.

9. The apparatus of claim 7, wherein the one or more processors are further configured to estimate the abnormal state in response to a fluctuation range of the score $S_t$ being greater than a threshold value, and display a warning corresponding to the abnormal state.

10. The apparatus of claim 7, wherein the one or more processors are further configured to estimate the abnormal state in response to a fluctuation range of the score $S_t$ being greater than an average of fluctuation ranges measured prior to the calculating of the score $S_t$ and being less than a threshold value, and perform the real-time battery stabilization in response to the abnormal state.

11. The apparatus of claim 7, wherein the one or more processors are further configured to calculate a variance of scores $S_t$, estimate the abnormal state in response to the calculated variance being greater than a threshold value, and display a warning corresponding to the abnormal state.

12. A battery state estimating method implemented by one or more processors of a computing apparatus, of performing a real-time battery stabilization using a battery state estimation, the method comprising:

using one or more sensors for the computing apparatus, sensing charging voltage data for a current battery and for a plurality of batteries at a battery life termination point, wherein the sensed charging voltage data for the plurality of batteries at the battery life termination point is pre-stored extracting, using the one or more processors in communication with the one or more sensors, partial data corresponding to a section from the sensed charging voltage data;

determining, using the one or more processors, a first distance between data extracted from pre-stored charging voltage data of an initial battery life and the partial data extracted from the sensed charging voltage data of the current battery, for reducing a computation or calculation workload using the partial data in the determining of the first distance;

determining, using the one or more processors, a second distance between the data extracted from the pre-stored charging voltage data of the initial battery life and data extracted from the pre-stored charging voltage data of the plurality of batteries at the battery life termination point;

determining, using the one or more processors, a score using the first distance and the second distance; and estimating, using the one or more processors, an abnormal state of the current battery using the score, such that the real-time battery stabilization is provided using a result of the estimating.

13. The method of claim 12, wherein the sensed charging voltage data comprises charging voltage data of the initial battery life, charging voltage data of the plurality of batteries at the battery life termination point, and charging voltage data of the current battery.

14. The method of claim 12, wherein the extracting of the partial data comprises one of:
    extracting charging voltage data for a predetermined amount of time from the sensed charging voltage data of the current battery,
    extracting charging voltage data at a predetermined time interval from the sensed charging voltage data of the current battery, and
    extracting charging voltage data at the predetermined time interval for the predetermined amount of time from the sensed charging voltage data of the current battery.

15. The method of claim 12, wherein the score is dependent on a relationship between the first distance and the second distance.

16. The method of claim 12, wherein the determining of the first and second distances further comprises:
    determining the first and second distances using one of a Euclidian distance calculation method, a Mahalanobis distance calculation distance, and a cosine similarity calculation method.

17. The method of claim 12, wherein the determining the score further comprises:
    calculating a score $S_t$ as the score, using an equation $$S_t = 1 - \left(\frac{D_t}{D_{max}}\right),$$

wherein $D_t$ denotes the first distance, and $D_{max}$ denotes the second distance.

18. The method of claim 12, wherein the estimating of the abnormal state of the current battery further comprises:
    estimating the abnormal state of the current battery in response to a fluctuation range of the score being greater than a threshold value; and
    displaying a warning corresponding to the abnormal state.

19. The method of claim 12, wherein the estimating of the abnormal state of the current battery further comprises:
    estimating the abnormal state of the current battery in response to a fluctuation range of the score being greater than an average of fluctuation ranges measured prior to the determining of the score and being less than a threshold value; and
    performing the real-time battery stabilization in response to the abnormal state.

20. A non-transitory computer-readable storage medium comprising a program comprising instructions to cause a computer to perform the method of claim 12.

* * * * *